United States Patent [19]
Johnson et al.

[11] Patent Number: 6,067,229
[45] Date of Patent: May 23, 2000

[54] HEAT DISSIPATING ENCLOSURE FOR ELECTRONIC COMPONENTS

[75] Inventors: Charles E. Johnson; Edward A. Morrell, both of Randolph, N.J.

[73] Assignee: Lucent Technologies, Inc., Murray Hill, N.J.

[21] Appl. No.: 08/866,752

[22] Filed: May 30, 1997

[51] Int. Cl.$^7$ ...................................................... H05K 7/20
[52] U.S. Cl. ........................ 361/704; 361/690; 361/688; 361/689; 174/16.1; 174/16.3; 165/80.3; 165/185
[58] Field of Search ............................ 361/679, 687–690, 361/694, 695, 697, 724, 703, 704; 174/16.1, 16.3; 165/80.3, 104.33, 185

[56] References Cited

U.S. PATENT DOCUMENTS

| | | |
|---|---|---|
| 4,259,843 | 4/1981 | Kausch . |
| 4,535,386 | 8/1985 | Frey, Jr. et al. . |
| 4,839,547 | 6/1989 | Lordo et al. . |
| 5,077,601 | 12/1991 | Hatada et al. ........................ 165/80.3 |
| 5,168,348 | 12/1992 | Chu et al. . |
| 5,309,315 | 5/1994 | Naedel et al. ........................ 361/704 |
| 5,518,071 | 5/1996 | Lee . |
| 5,694,295 | 12/1997 | Mochizuki et al. ..................... 361/699 |
| 5,761,042 | 6/1998 | Widmayer et al. ...................... 361/704 |
| 5,930,113 | 7/1999 | McCann .................................. 361/704 |
| 5,946,193 | 8/1999 | Hendrix et al. .......................... 361/704 |

*Primary Examiner*—Leo P. Picard
*Assistant Examiner*—Boris L. Chervinsky

[57] ABSTRACT

A device for housing electronic components that produce heat and must be cooled. The device includes a housing having at least one vertical wall that has an interior surface and a corresponding exterior surface. Rows of vains are disposed on the interior surface of the wall. Each row of vains contains a plurality of parallel vains having the same general dimensions. Adjacent rows of vains are not aligned. As a result, the vains on one internal row do not lay in the same line as vains from adjacent internal rows. External vains are disposed on the exterior surface of the wall, opposite the internal vains. The external vains correspond in position and number with the internal vains. Heat absorbed by the internal vains is transferred to the external vains by conduction, wherein the external vains dissipate the absorbed heat to the surrounding environment with an efficiency that is made possible by the configuration of the vains.

16 Claims, 5 Drawing Sheets

HEAT DISSIPATING ENCLOSURE FOR ELECTRONIC COMPONENTS

BACKGROUND OF THE INVENTION

1. Field of the Invention

In general, the present invention relates to protective housings for electronic components. More specifically, the present invention relates to protective housings for electronic components that help dissipate heat produced by the electronic components.

2. Description of the Prior Art

It is well known that certain configurations of electronic components generate significant heat as a result of their operation. It is also well known that if the produced heat is not dissipated, the rise in temperature surrounding the electronic components can cause the those electronic components to fail. For this reason, many electronic components are manufactured with heat sink structures that are intended to absorb the heat produced by the electronic components and dissipate that excess heat into the surrounding environment. In many applications, the various heat sink structures are positioned near vents so that natural convection cooling occurs with the surrounding environment. In other applications, heat dissipation is assisted by a fan that forces air past the various electronic components and the heat sink structures. The passing air greatly increases convection, thereby adding to the rate at which the electronic components are cooled.

Often electronic components are placed in environments that are exposed to the elements. For example, electronic components are often suspended along telephone lines and on the exterior of buildings. In such applications the electronic components must be hermetically sealed and isolated from the surrounding environment. If the electronic components are not isolated from the surrounding environment, mist, due, rain, dust and other contaminants could contact the electronic components and cause those components to fail.

Since the electronic components must be isolated from the surrounding environment, traditional cooling schemes that uses external air to directly cool the electronic components can not be used. Rather, in the prior art, electronic components that must be cooled are often placed within a protective housing. The protective housing isolates the electronic components from the surrounding environment. Furthermore, the protective housing itself is used as a heat sink structure wherein the structure of the housing absorbs heat from the electronic components and the housing surrenders heat to the surrounding environment by convection.

Prior art protective housings are exemplified by U.S. Pat. No. 4,535,386 to Frey et al., entitled NATURAL CONVECTION COOLING SYSTEM FOR ELECTRONIC COMPONENTS and U.S. Pat. No. 4,259,843 to Kausch, entitled ISOLATION CHAMBER FOR ELECTRONIC DEVICES. A problem associated with prior art protective housings is that the protective housing tends to absorb heat from the electronic components and loose heat to the surrounding environment with a relatively low efficiency. As a result, the amount of heat capable of being dissipated is relatively small, thereby limiting the types of electronic components that can be placed in a housing of a certain size. Furthermore, since the heat exchange efficiency of such prior art protective housings is relatively small, the protective housing must often be much larger than is needed to surround the electronic components in order to provide enough surface area for proper heat exchange rates.

A need therefore exists in the art for a protective housing for electronic components that has a high heat dissipation efficiency and need not be much larger that the electronic components that the housing protects.

SUMMARY OF THE INVENTION

The present invention is a device for housing electronic components that produce heat and must be cooled. The device includes a housing having at least one vertical wall that has an interior surface and a corresponding exterior surface. Rows of vains are disposed on the interior surface of the wall. Each row of vains contains a plurality of parallel vains having the same general dimensions. Adjacent rows of vains are not aligned. As a result, the vains on one internal row do not lay in the same line as vains from adjacent internal rows. The staggered configuration promotes heat transfer efficiency in between the air within the housing and the internal vains.

External vains are disposed on the exterior surface of the wall, opposite the internal vains. The external vains correspond in position and number with the internal vains. Heat absorbed by the internal vains is transferred to the external vains by conduction, wherein the external vains dissipate the absorbed heat to the surrounding environment with an efficiency that is made possible by the configuration of the vains.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Figure 1:
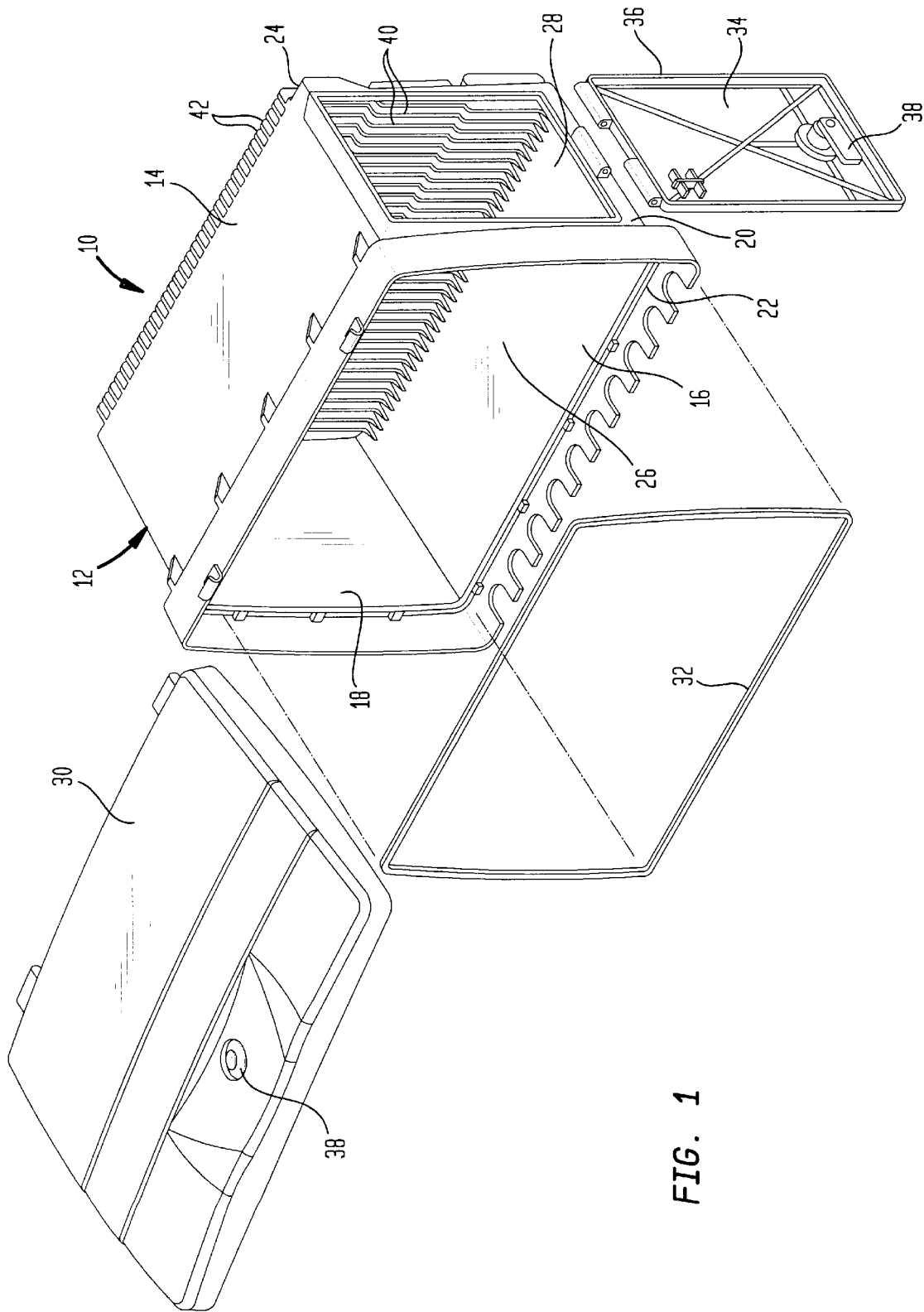
FIG. 1 is a perspective view of an exemplary embodiment of a housing assembly in accordance with the present invention.

Referring to FIG. 1, an exemplary embodiment of a protective housing assembly 10 is shown in accordance with the present invention. The protective housing assembly 10 includes a primary housing having a top surface 14, bottom surface 16, left side surface 18, right side surface 20, front surface 22 and rear surface 24. The housing 12 is preferably cast of a non-corrosive metal having a high heat conductivity. Appropriate metals include aluminum and aluminum alloys, however other metals such as titanium alloys, stainless steel and the like can also be used. The metal selected for the housing also has a high electrical conductivity. In this manner the housing can serve as a Faraday cage for any electronic components placed within the housing, thereby protecting those electronic components from certain types of electromagnetic interference.

In the shown embodiment, the front surface 22 and the right side surface 20 of the housing 12 define access openings 26, 28 that enable the interior regions of the housing 12 to be reached. The access opening 26 defined by the front surface 22 of the housing 12 can be selectively closed by a main access door 30. A gasket 32 fits in between the housing 12 and the main access door 30. As a result, when the main access door 30 is closed against the housing 12, an air tight seal is created that seals the front surface 22 of the housing 12. The main access door 30 is preferably made of the same material as is the housing 12. The main access door 30 bolts to the housing 12 over the gasket 32. As a result, the main access door 30 is electrically coupled to the housing 12 and can serve as part of the Faraday cage in providing electromagnetic protection to the contents of the housing 12.

A side access door 34 is provided to cover the access opening 28 defined by the right side surface 20 of the housing 12. The side door 34 also contains a gasket 36 that surrounds the periphery of the door 34 and seals against the housing 12 to prevent air and/or moisture from entering the housing 12. Both the main access door 30 and the side access door 34 may include lock assemblies 38 that prevent unauthorized personnel from opening these doors without the proper key.

Figure 2:
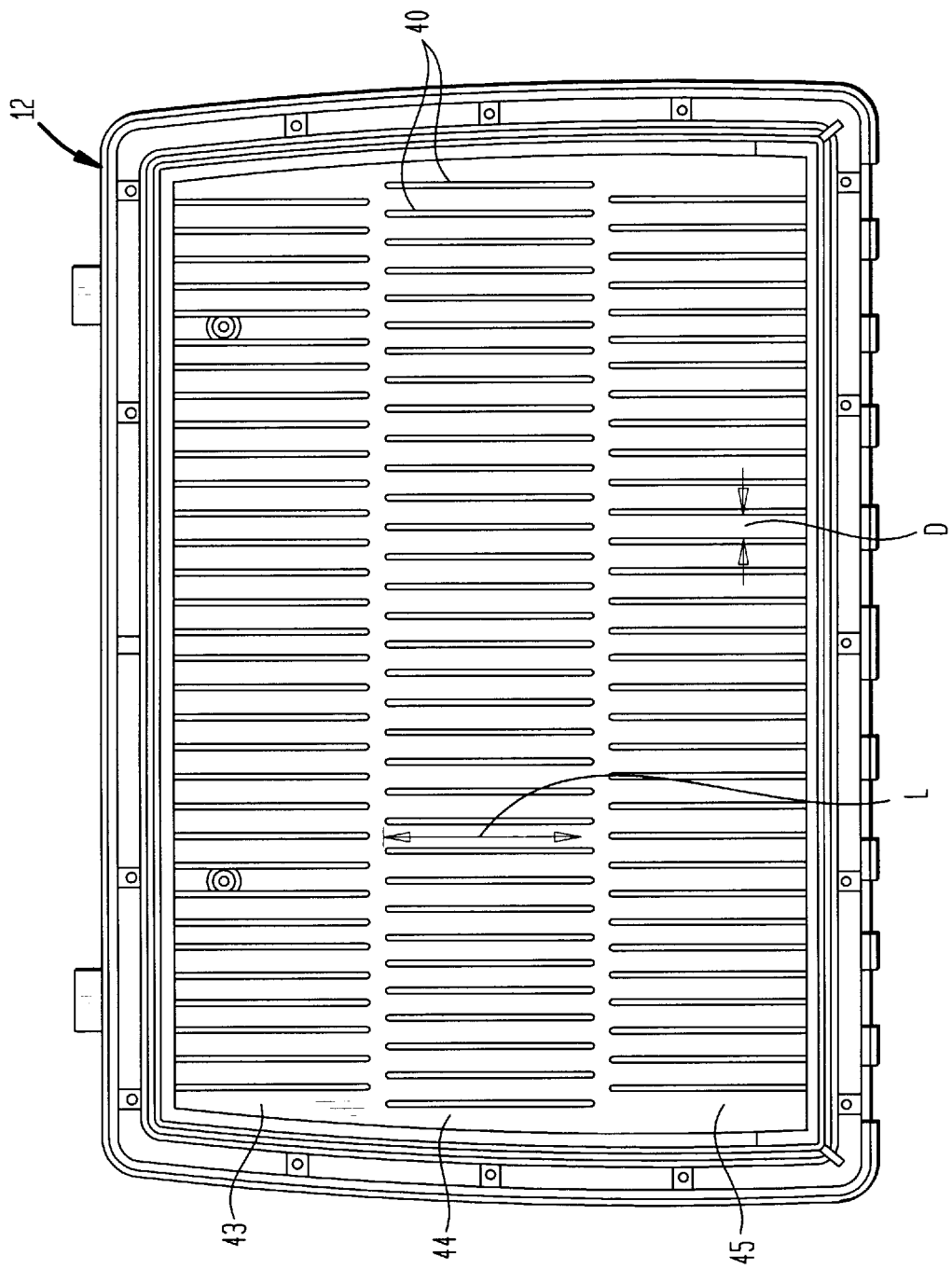
FIG. 2 is a front view of the housing component of the assembly shown in FIG. 1.

In the shown embodiment, the rear surface 24 of the housing 12 contains internal vains 40 and external vains 42. The presence of the vains 40, 42 on the rear surface 24 of the housing 12 is merely exemplary and it should be understood that the vains can be on any surface of the housing 12 that lays in a vertical plane when the housing 12 is mounted into its operating position. Referring to FIG. 2, it can be seen that the vains 40 on the interior of the housing 12 are arranged in different distinct rows 43, 44, 45. On each of the rows 43, 44, 45, the vains 40 are identical and are arranged generally in parallel. Furthermore, on each of the rows 43, 44, 45, the vains 40 have a predetermined length L and a predetermined distance D between vains 40. The position of the vains 40 on different rows 43, 44, 45 is staggered. As such, a vain 40 on one row will not vertically align with the vains 40 on the rows above and below. Rather, a vain 40 on one row aligns with the space in between vains on the adjacent rows. Preferably, the predetermined length L of the vains 40 is between two inches and four inches. Likewise, the preferred distance D in between vains in the same row is between 0.25 inches and 0.50 inches.

Figure 3:
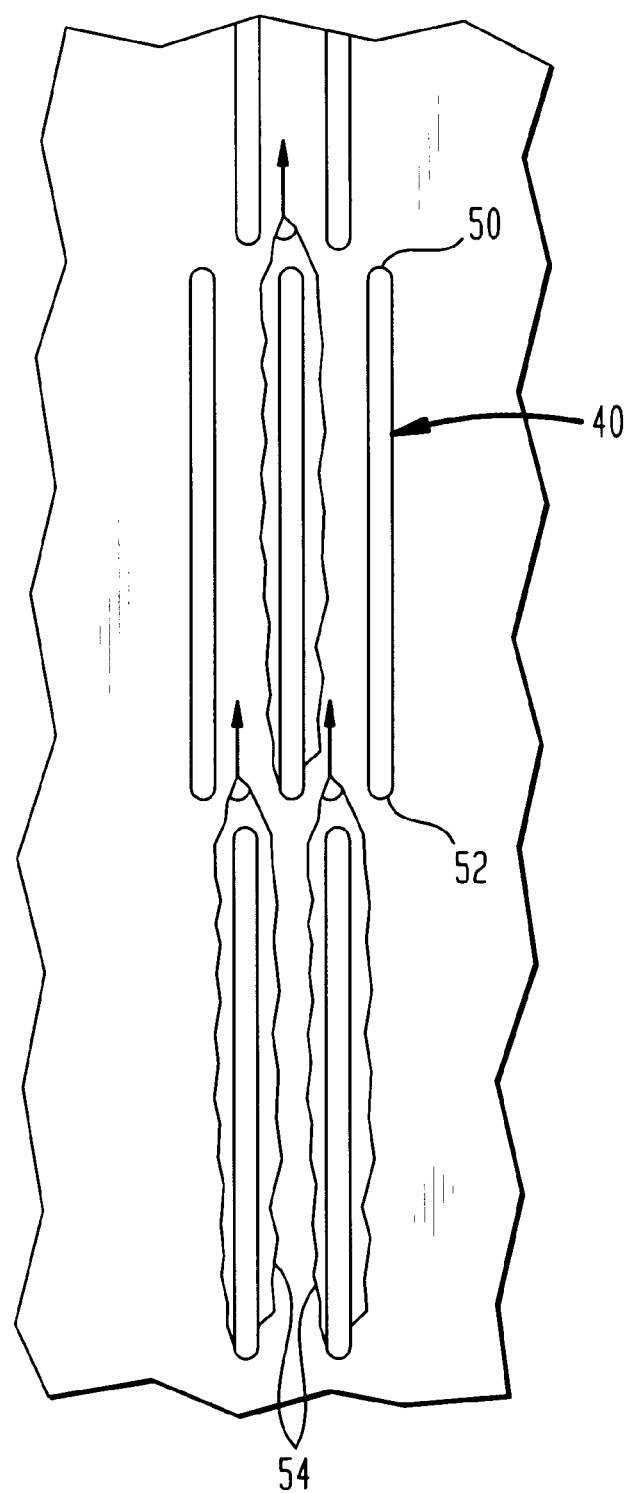
FIG. 3 is an enlarged view of a section of FIG. 2 showing the details of the construction of the internal vains.

Referring to FIG. 3, it can be seen that the top edges 50 and the bottom edges 52 of the various vains 40 are rounded. As heat is generated within the confines of the housing assembly, convection causes the heat to rise past the various vains 40. As the heat passes the vains 40, boundary layers 54 in the air flow are created along the side surfaces of the vains 40. The boundary layers 54 grow larger as the heat travels along the length of each of the vains 40. As the boundary layers 54 grow larger, the heat transfer between the surrounding air and the vains 40 grows less efficient. By making the vains thin, short and in staggered rows, heat transfer between the vains 40 and the surrounding air is greatly improved over systems that use single long vains. By using short vains, the boundary layers 54 of air flow are not given enough space to fully develop and are therefore kept small. Furthermore, as the air flows past the rounded top ends 50 of the vains 54, turbulence in the air flow is reduced. The next higher row of vains therefore receives a smooth air flow. By staggering the different rows of vains 40, the boundary layers 54 of air flow created by lower rows of vains 54 are disrupted and are not perpetuated across subsequent rows. As a result, a new boundary layer 54 must form anew along each vain in each row. The short staggered rows of vains 40 therefore keeps the development of bound-ary layers 54 in the flow of air to a minimum, thereby increasing heat transfer efficiency.

Figure 4:
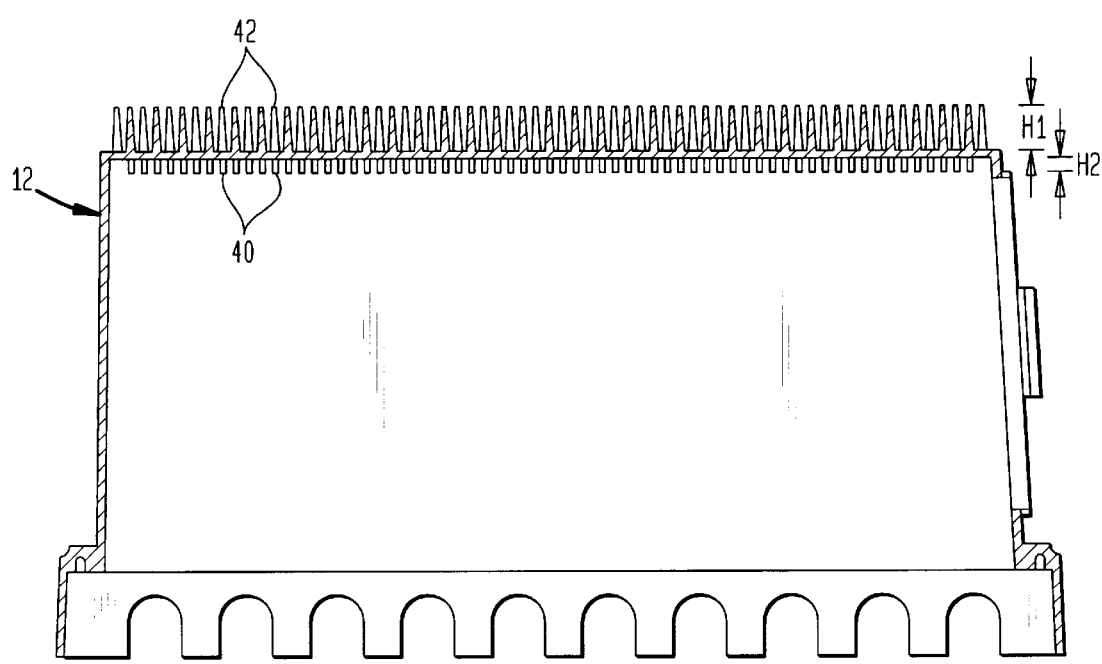
FIG. 4 is cross-sectional view of the housing component of the assembly shown in FIG. 1.
Figure 5:
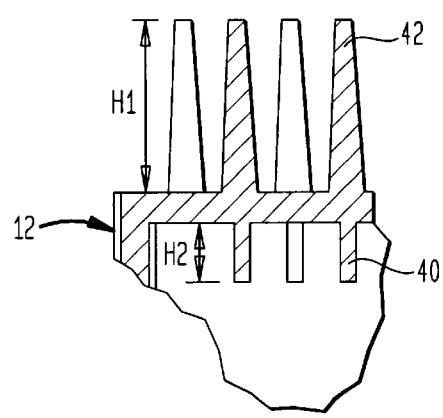
FIG. 5 is an enlarged view of a section of FIG. 4 showing the details of the internal and external vains.

Referring to FIG. 4 and FIG. 5, it can be seen that each of the vains 40 on the interior of the housing 12 directly corresponds in position to one of the vains 42 on the exterior of the housing 12. As a result, a direct path of heat conduction is provided in between the interior vains 40 and the exterior vains 42, wherein the heat conduction path is kept to a minimum. Accordingly, the transfer of heat from the interior vains 40 to the exterior vanes 42 is highly efficient. From FIG. 4 and FIG. 5, it can also be seen that the exterior vains 42 have a height H1 that is more than twice as high as the height H2 of the interior vains 40. The larger exterior vains 42 ensure proper heat dissipation to the surrounding environment even on hot summer days when the exterior vains 42 are exposed to the direct sunlight.

Figure 6:
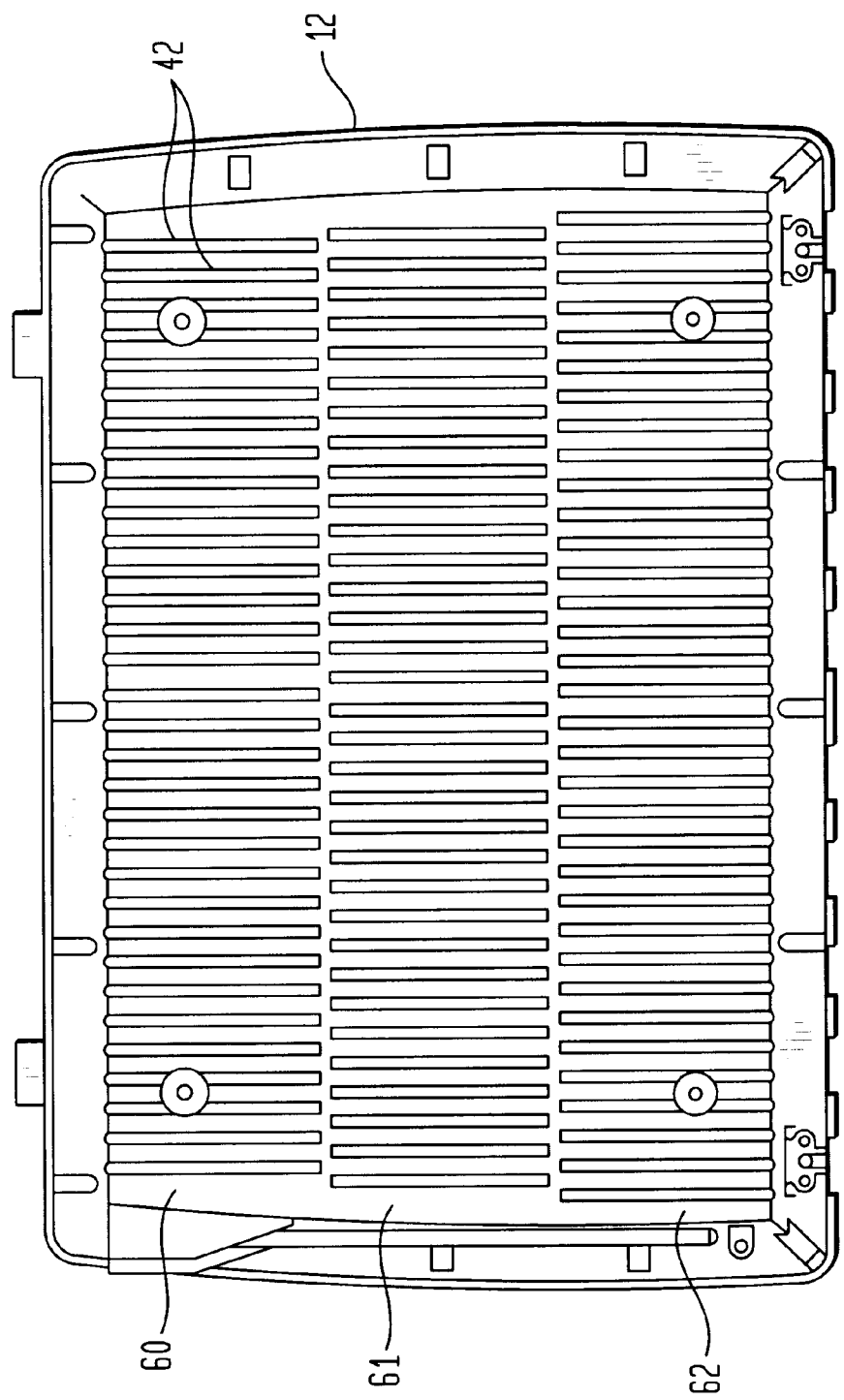
FIG. 6 is a rear view of the housing component of the assembly shown in FIG. 1.

Referring to FIG. 6, it can be seen that the exterior vains 42 are also arranged in separate staggered rows 60, 61, 62 as were the interior vains. The top and bottom edges of the exterior vains 42 are also rounded. The reasons for the short staggered rows 60, 61, 62 of vains 42 on the exterior of the housing 12 are the same as before explained for the interior vains. By using short vains 42, the boundary layers of air flow are not given enough space to fully develop and are therefore kept small. Furthermore, as the air flows past the rounded ends of the vains 42, turbulence is reduced. The next higher row of vains therefore receives a smooth air flow. By staggering the different rows 60, 61, 62 of vains 40, the boundary layers of air flow created by lower rows of vains are disrupted and are not perpetuated across subsequent rows. As a result, a new boundary layer must form anew along each of the vains 42 in each of the rows 60, 61, 62. The short staggered rows of vains 42 therefore keep the development of boundary layers in the flow of air to a minimum, thereby increasing heat transfer efficiency.

The housing 12 of the present invention is preferable die cast molded. Referring back to FIG. 5, it can be seen that both the vains on the interior of the housing and on the exterior of the housing may be made with slight tapered to enable such features to be more readily cast during production.

It will be understood that the embodiments of the present invention specifically shown and described are merely exemplary and that a person skilled in the art can make alternate embodiments using different configurations and functionally equivalent components. All such alternate embodiments are intended to be included in the scope of this invention as set forth in the following claims.

What is claimed is:

1. A device comprising:
    a housing having a plurality of interior surfaces and a plurality of exterior surfaces;
    a first plurality of generally parallel vains coupled to at least one of said interior surfaces; and
    at least one second plurality of generally parallel vains coupled to said housing adjacent said first plurality of generally parallel vains, wherein said first plurality of vains and said at least one second plurality of vains are positionally staggered, said device further including vains on at least one exterior surface of said housing, wherein said vains on said at least one exterior surface correspond in position and number to both said first plurality of vains and said at least one second plurality of vains on the interior of said housing.

2. The device according to claim 1, wherein said plurality of interior surfaces includes a vertical surface and said first plurality of vains and said at least one second plurality of vains are disposed on said vertical surface.

3. The device according to claim 1, wherein said housing includes at least one closable access opening for accessing said interior surface of said housing.

4. The device according to claim 1, wherein said housing is hermetically sealed.

5. The device according to claim 1, wherein said housing produces a Faraday cage around and object placed within said housing.

6. The device according to claim 1, wherein said first plurality of vains share the same length and thickness, and each of said first plurality of vains are separated from each other by a predetermined distance.

7. The device according to claim 6, wherein said at least one second plurality of vains share the same length, thickness as said first plurality of vains and said at least one second plurality of vains are separated from each other by said predetermined distance.

8. The device according to claim 7, wherein said length is between two inches and four inches.

9. The device according to claim 8, wherein said predetermined distance is between 0.25 inches and 0.50 inches.

10. The device according to claim 1 wherein said vains on the exterior of the housing protrude outwardly to a greater extent than said first plurality of vains and said at least one second plurality of vains on the interior of said housing.

11. A housing assembly for housing electronic components, comprising:

a housing having a wall with an internal surface and an external surface; and a plurality of rows of internal vains disposed on said internal surface, wherein each row contains numerous parallel internal vains of generally the same dimensions and wherein the internal vains of adjacent rows do not align, said assembly further including external vains disposed on said external surface of said housing, wherein said external vains on said external surface correspond in position and number to said internal vains disposed on said internal surface.

12. The assembly according to claim 11, wherein said wall lays in a vertical plane in said housing.

13. The assembly according to claim 11, wherein said housing includes at least one closable access opening for accessing an interior region of said housing.

14. The assembly according to claim 11, wherein said housing is hermetically sealed.

15. The assembly according to claim 13, wherein said housing produces a Faraday cage around electronic components placed within said housing.

16. The assembly according to claim 13 wherein said exterior vains have a height greater than that of said interior vains.

* * * * *